United States Patent

Favors

[15] 3,671,889

[45] June 20, 1972

[54] BROADBAND COMPOSITE FILTER CIRCUIT

[72] Inventor: Hollice A. Favors, 5154 Chimineas Ave., Tarzana, Calif. 91356

[22] Filed: June 1, 1970

[21] Appl. No.: 42,381

[52] U.S. Cl. ....................................333/76, 333/70, 333/77, 333/28, 333/24

[51] Int. Cl. ..........................................................H03h 7/08

[58] Field of Search .........................333/70, 75, 76, 24, 8, 26

[56] References Cited

UNITED STATES PATENTS

| | | | |
|---|---|---|---|
| 3,443,250 | 5/1969 | Feistel | 333/76 |
| 2,932,804 | 4/1960 | Mattson | 333/28 |
| 2,076,248 | 4/1937 | Norton | 333/8 |
| 2,209,390 | 7/1940 | Curtis | 333/24 |
| 1,959,494 | 5/1934 | Nyquist | 333/24 |

*Primary Examiner*—Herman Karl Saalbach
*Assistant Examiner*—C. Baraff
*Attorney*—Ronald W. Reagin

[57] ABSTRACT

A broadband composite filter circuit is disclosed which includes a plurality of filter networks, each being tuned to respond to a respective frequency bandwidth of electrical signals. Each of the filter networks is a four terminal filter network having a positive and a negative network input terminal and a positive and a negative network output terminal. The input terminals of all of the filter networks are connected in series with each other in a first predetermined order. The output terminals of all of the filer networks are connected in a series circuit with each other in a second predetermined order which is the opposite to the above mentioned first predetermined order. The input signal is then applied across the series input circuits and the output signal is derived from across the series output circuits. A switch is provided across the input terminals of each of the filter networks to enable each network to be selectively shorted out of the composite circuit to selectively vary the overall frequency response characteristic of the composite filter circuit.

6 Claims, 4 Drawing Figures

INVENTOR.
HOLLICE A. FAVORS
BY
ATTORNEY

BROADBAND COMPOSITE FILTER CIRCUIT

This invention relates to filter circuits and more particularly to a broadband composite filter circuit constructed from a plurality of filter network sections in which different sections having different frequency responses may easily be switched in and out of the circuit.

There are many applications in which it would be desirable to have a passive filter circuit which has extremely broad bandwidth and which could easily and quickly be modified to accept or reject signals having different frequencies. However, such circuits have proven to be very difficult to construct in the past. For example, the mere making of a broad bandwidth passive filter has proven to be quite difficult because of the inherent incompatibility between broad bandwidth circuits and high Q tuned circuits which have the desired sharp frequency responses usually needed for filter circuits. High Q circuits are inherently narrow bandwidth so a designer must always compromise between sharpness of cutoff and bandwidth. Further, once a successful filter circuit has been designed which works over a particular bandwidth, its bandwidth cannot be expanded merely by changing the values of some of the reactive elements (inductances and capacitances), since successive reactive elements are interdependent upon each other, and changing the value of one will cause changes other than at that particular element.

One approach to the problem which seems attractive, especially if frequency selectivity is also desired, is to provide a composite filter circuit which is composed of a plurality of individual filter networks each of which is responsive to a different frequency band. The desired selectivity can be achieved by simply switching different filter networks into and out of the composite filter circuit. However, in practice this too has proved to be quite difficult. The problem becomes the manner of connecting the filter networks into the composite filter circuit. For example, obviously the filter networks cannot be connected in series since any signal that is accepted by one of the filter networks will be rejected by all of the others, and thus no signals at all will pass the series circuit. Thus, most of the prior art attempts to make composite filter circuits from a plurality of filter networks have arranged the filter networks in some form of parallel connection.

The primary difficulty with this has been that as more and more filter networks are connected in parallel, the input and output impedances become too low. Also, a signal sees more and more paths to ground, and if the parallel arrangement is of broad bandwidth, an input signal in the desired bandwidth will usually be shorted to ground by the low impedance which is presented to that frequency by one of the filter networks which is designed to pass a quite different frequency.

Probably the most acceptable compromise to date is to provide a composite filter circuit in which the filter networks themselves are connected in parallel, with all of the input circuits of the filter networks connected in series between the input circuit terminals and all of the output circuits of the filter networks being connected in series between the output terminals. This approach overcomes the low impedance and shorting problems mentioned above but presents additional problems of its own. Inherently, some input and output circuits of the networks will be closer to ground potential than will the input and output circuits of other filter networks, with the latter filter networks having a higher impedance between them and ground. Thus, the composite filter circuit will show a substantially higher gain for the frequencies corresponding to these latter filter networks because they are operating at higher impedance levels, and the signals having frequencies corresponding to the filter networks located closer to ground will show less gain.

It is accordingly an object of the present invention to provide an improved composite filter network.

It is yet another object of the present invention to provide an improved composite filter circuit which has a substantially uniform gain for all signals responsive to the various filter networks in the composite filter circuit.

It is yet another object of the present invention to provide an improved composite filter circuit in which different filter networks can easily be switched into and out of the circuit to change the overall frequency response of the filter circuit.

Briefly stated, and in accordance with the presently preferred embodiment of the invention, a composite filter circuit is provided which includes a plurality of filter networks, each being tuned to respond to a respective frequency bandwidth of electrical signals. Each of the filter networks is a four terminal filter network having a positive and a negative network input terminal and a positive and a negative network output terminal. The input terminals of all of the filter networks are connected in series with each other in a first predetermined order. The output terminals of all of the filter networks are connected in a series circuit with each other in a second predetermined order which is the opposite to the above mentioned first predetermined order. The input signal is then applied across the series input circuits and the output signal is derived from across the series output circuits.

For a complete understanding of the invention, and an appreciation of other objects and advantages thereof, please refer to the attached drawings, in which.

Figure 1:
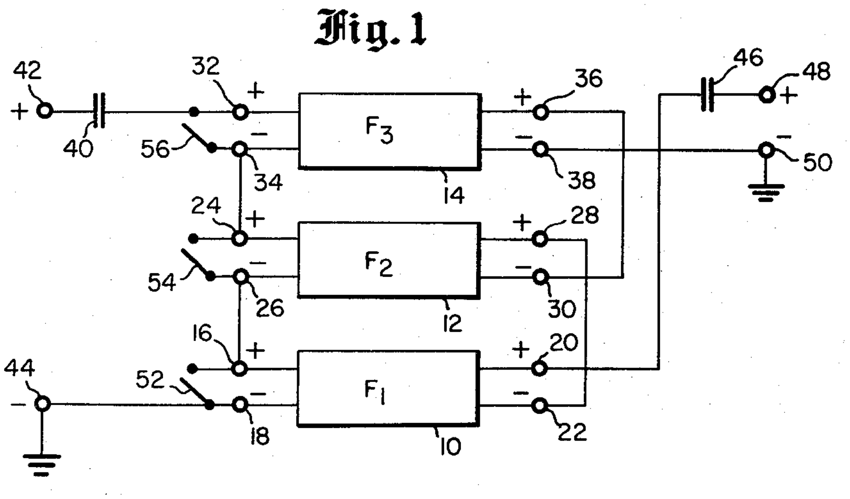
FIG. 1 shows a schematic representation of a composite filter circuit in accordance with the present invention.

FIG. 1 shows a schematic representation of a composite filter circuit in accordance with the present invention. As shown therein, the circuit includes three filter networks 10, 12 and 14, designated $F_1$, $F_2$, and $F_3$ respectively. These filter networks may be any of the known four-terminal filter networks each of which has a frequency response characteristic corresponding to a portion of the desired frequency response characteristic of the entire composite filter circuit. The frequency response characteristics of the individual filter networks and of the composite filter circuit are shown and discussed in more detail in connection with FIGS. 3 and 4 below.

Continuing the description of FIG. 1, each of the filter networks 10, 12 and 14 includes a pair of input terminals and a pair of output terminals. Filter network 10 has network input terminals 16 and 18 and network output terminals 20 and 22. Filter network 12 has network input terminals 24 and 26 and network output terminals 28 and 30. Filter network 14 has network input terminals 32 and 34 and network output terminals 36 and 38.

Each of these network input and output terminals may be assigned a polarity. Of course, this assigned polarity is only relative, since by their nature, the filters handle AC signals of varying polarity. Polarity may be assigned to the terminals such that the application of a positive polarity signal to the input terminal designated the positive input terminal causes an output of a positive polarity signal on the output terminal designated the positive output terminal. Using this convention, the positive network input terminals of filters 10, 12 and 14 are terminals 16, 24 and 32 respectively and the negative network input terminals are terminals 18, 26 and 34 respectively. In a similar manner, the positive network output terminals are terminals 20, 28 and 36 respectively and the negative network output terminals are terminals 22, 30 and 38 respectively.

In accordance with the present invention, the input and output network terminals are connected in a manner shown in FIG. 1 to overcome the above described disadvantages of the prior art composite filter circuit arrangements. Thus, the network input terminals are connected in series in one order, with positive network input terminal 16 of filter network 10 being connected to negative network input terminal 26 of filter network 12, and with positive network input terminal 24 of filter network 12 being connected to negative network input terminal 34 of filter network 14. The input circuit is completed by connecting positive network input terminal 32 of filter network 14 through a blocking capacitor 40 to positive circuit input terminal 42 and by connecting negative network input terminal 18 of filter network 10 to the negative circuit input terminal 44, which may conveniently be connected to ground potential. Again, the same convention described above is used to assign polarity to circuit input terminals 42 and 44.

Further in accordance with the present invention, the output terminals of the filter networks are connected in series with each other but in the opposite sequence in which the input terminals are connected. Thus, positive network output terminal 20 of filter network 10 is connected through a blocking capacitor 46 to the positive circuit output terminal 48, negative network output terminal 22 of filter network 10 is connected to positive network output terminal 28 of filter network 12 and negative network output terminal 30 of filter network 12 is connected to positive network output terminal 36 of filter network 14. The circuit is completed by connecting negative network output terminal 38 of filter network 14 directly to the circuit negative output terminal 50, which may again be connected directly to ground potential.

The circuit arrangement shown in FIG. 1 overcomes the disadvantages of the prior art discussed above because those filter networks whose inputs are located at the highest impedance levels also have their outputs located at the lowest impedance levels. Thus, filter network 14 also designated as $F_3$, has its input circuit located above the input impedances of filter networks 10 and 12 but has its output impedance located directly above ground. Conversely, filter network 10,also designated $F_1$, has its input impedance located just above ground but has its output impedance above the output impedances of filter networks 12 and 14. Filter network 10, also designated $F_2$, has both its input and its output impedances located between the input and output impedances of filter networks 10 and 14. Thus, the added gain which filter network 14 achieves from its high input impedance is offset by its reduced gain caused by its low level output impedance and conversely the reduced gain of filter network 10 caused by its low level input impedance is offset by its increased gain caused by its high level output impedance. Thus, the effect of the location of the impedance levels of the different filter networks is effectively compensated for by the unique connection of the filter networks in accordance with the present invention.

It is noted that FIG. 1 shows a composite filter circuit constructed from three filter networks. Of course, the invention is not limited to the use of any particular number of filter networks, but is instead applicable to a similar arrangement of N filter networks, where N is any integer greater than one. The connections for the nth filter in a N array would be as follows: The positive input terminal of the nth filter is connected to the negative input terminal of the $(n+1)$th filter network and the negative input terminal of the $n$th filter is connected to the positive input terminal of the $(n-1)$th filter network. The positive input terminal of the Nth filter network is connected to the positive circuit input terminal and the negative input terminal of the first filter network is connected to the negative circuit input terminal. Using the same conventions, the positive output terminal of the $n$th filter network is connected to the negative output terminal of the $(n-1)$th filter network, and the negative output terminal of the $n$th filter network is connected to the positive output terminal of the $(n+1)$th filter network. The positive output terminal of the first filter network is connected to the positive circuit output terminal and the negative output terminal of the Nth filter network is connected to the negative circuit output terminal.

In the above discussion, it has been assumed that in a N filter network composite circuit, progressively higher values of the integer N are assigned either to filter networks having progressively higher frequency response characteristics or progressively lower frequency response characteristics. However, it is not necessary that either of these conventions be followed when making the connections shown in FIG. 1 above. Instead, the network input terminals may be randomly connected in series without regard to the progression of the frequencies of the filter networks. It is only necessary that whatever order is chosen when connecting the network input terminals in series, the opposite order be used in connecting the network output terminals in series.

FIG. 1 also shows switches 52, 54 and 56 connected across the network input terminals of filter networks 10, 12 and 14 respectively. By selectively closing these switches, selected ones of the filter networks may be effectively removed from the filter circuit by shorting out its input terminals. Thus, the overall frequency response of a composite filter circuit may be changed to a desired frequency response in the field without any internal reconnections merely by selectively actuating the switches 52, 54 and 56.

Of course, the switches 52, 54 and 56 could equally well have been placed across the network output terminals of filter networks 10, 12 and 14 respectively. This also would effectively remove selected ones of the filter networks from the composite filter circuit merely by shorting out its output terminals, but the shown arrangement of FIG. 1 is preferred, since it eliminates the chance of an undesired signal being coupled from a deactivated filter network to an activated network through a stray capacitance or inductance in the circuit.

Figure 2:
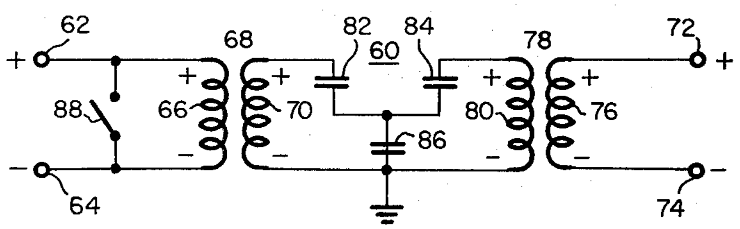
FIG. 2 shows a circuit diagram of one of the filter networks which may be used in the block diagram of FIG. 1.

FIG. 2 shows a circuit diagram of one filter network, of a type known to the prior art, which has been found to perform quite satisfactorily in the filter circuit of FIG. 1 in accordance with the present invention. The filter network 60 of FIG. 2 includes a positive network input terminal 62 and a negative network input terminal 64. These terminals are connected to the primary winding 66 of an input transformer 68, which also has a secondary winding 70. Filter network 60 also includes a positive network output terminal 72 and a negative network output terminal 74, each of which is connected to the secondary winding 76 of an output transformer 78, which also includes an input winding 80. The filter network 60 is completed by connecting capacitors 82 and 84 in series between the positive terminal of secondary winding 70 of input transformer 68 and the positive terminal of the primary winding 80 of output transformer 78, and by connecting capacitor 86 between the junction of capacitors 82 and 84 and the negative terminals of secondary winding 70 and primary winding 80. If desired, these negative terminals may conveniently be connected to a point of ground potential, as shown in FIG. 2.

FIG. 2 also shows a switch 88 connected between network input terminals 62 and 64 for selectively shorting across these terminals to remove the filter network from the composite filter circuit.

It is noted that the positive and negative polarities are assigned to different terminals in accordance with convention described above.

Figure 3:
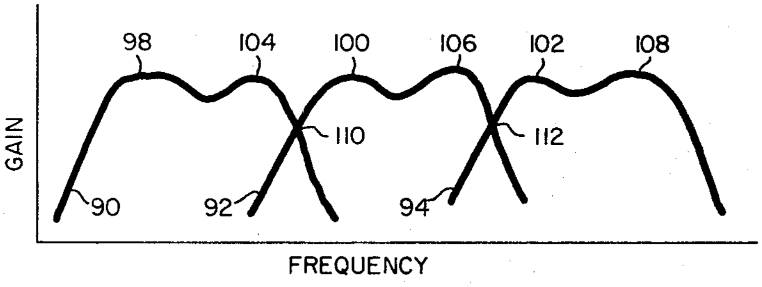
FIG. 3 shows the frequency responses of the various filter networks of FIG. 1.
Figure 4:
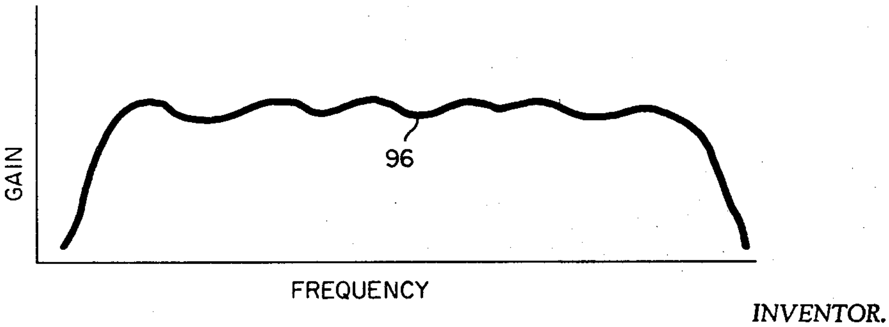
FIG. 4 shows the overall frequency response of the composite filter circuit of FIG. 1.

FIGS. 3 and 4 show respectively the frequency response characteristics of three typical filter networks which may be used in the composite filter circuit of FIG. 1 and the overall frequency response characteristic of the composite filter circuit. These figures show the gain of the filter networks and circuit as a function of frequency. Of course, the term "gain" is used in its conventional sense. Since the filter networks are entirely passive, they contribute no actual gain to any signal applied to them, and strictly speaking, the better term might be lack of attenuation instead of gain. However, the term "gain" is conventionally used by those skilled in the art to describe the frequency response of a passive filter, so it is also used here.

FIG. 3 shows three frequency response curves 90, 92 and 94 of three typical filter networks which might be used with the present invention. FIG. 4 shows a frequency response curve 96 which is the composite of the curves 90, 92 and 94 of FIG. 3 and shows a typical overall frequency response curve for a composite filter circuit such as is shown in FIG. 1.

Referring once again now to FIG. 3, and assuming that filter networks such as that shown in FIG. 2 above are used in the circuit of FIG. 1, each of the frequency response curves 90, 92 and 94 includes a first "hump" or resonant point 98, 100 and 120, respectively, which represents the natural resonant frequency of the filter network of FIG. 2 if the capacitor 86 is omitted from the network. The value of capacitor 86 in each network is then chosen to provide a second "hump" 104, 106 and 108 respectively to broaden out the bandwidth of each of the curves 90, 92 and 94, in the well known manner, and to provide the desired total composite output frequency characteristic 96 of FIG. 4 having the desired bandwidth and desired ripple factor. The value of these capacitors is also chosen so that the cross-over points 110 and 112 of the curves occurs about 4 to 5 db below the peaks of the curves so that no excessive ripple in the total composite curve occurs at the corresponding frequencies of these cross-over points.

While the invention is thus disclosed and the presently preferred embodiment thereof described in detail, it is not intended that the invention be limited to this shown embodiment. Instead, many modifications will occur to those skilled in the art which lie within the spirit and scope of the present invention. Accordingly, it is intended that the invention be limited in scope only by the appended claims.

What is claimed is:

1. A composite filter circuit comprising, in combination:

a. a plurality of filter networks each having a respective input section and output section, each of said filter network having respective positive and negative network input terminals for effecting electrical connection to its input section and respective positive and negative network output terminals for effecting electrical connection to its output section and being tuned to respond to a respective frequency bandwidth of electrical signals;

b. means for connecting said input terminals of said filter networks into an input circuit in which each of said input sections of said filter network is located at a different impedance level relative to a reference potential, said first means comprising means for connecting said input terminals of said filter networks in series with each other in a first predetermined order;

c. second means for connecting said output terminals of said filter networks into an output circuit in which each of said output sections of said filter networks is located at an impedance level relative to said reference potential which is a compensating impedance level relative to the impedance level at which its corresponding input section is located, said second means comprising means for connecting said output terminals of said filter networks in series with each other in a second predetermined order opposite to said first predetermined order, whereby those filter networks which have their input sections located at relatively higher impedance levels, and which accordingly exhibit relatively greater gain, have their output sections located at relatively lower impedance levels, and accordingly exhibit relatively lower gain, and those filter networks which have their input sections located at relatively lower impedance levels, and which accordingly exhibit relatively lower gain, have their output sections located at relatively higher impedance levels, and accordingly exhibit relatively higher gains, all whereby compensation is provided for non-uniformity of gain caused by said different impedance levels;

d. means for applying an input signal to said input circuit; and e. means for deriving an output signal from said output circuit.

2. The composite filter circuit of claim 1 in which:

a. said plurality of filter networks comprises N filter networks, where N is any integer greater than 1;

b. said means for applying an input signal comprises positive and negative circuit input terminals and said means for deriving an output signal comprises positive and negative circuit output terminals;

c. said input circuit comprises a series connection of said network input terminals in which the positive input terminal of the $n$th filter network is connected to the negative input terminal of the $(n+1)$th filter network and the negative input terminal of said $n$th filter network is connected to the positive input terminal of the $(n-1)$th filter network, with the positive input terminal of the Nth filter network being connected to said positive circuit input terminal and the negative input terminal of the first filter network being connected to said negative circuit input terminal; and d. said output circuit comprises a series connection of said network output terminals in which the positive output terminal of the $n$th filter network is connected to the negative output terminal of the $(n-1)$th filter network and the negative output terminal of the $n$th filter network is connected to the positive output terminal of the $(n+1)$th filter network, with the positive output terminal of said first filter network being connected to said positive circuit output terminal and the negative output terminal of said Nth filter network being connected to said negative circuit output terminal.

3. The composite filter circuit of claim 2 which further includes selective means for connecting individual ones of said filter networks into said composite filter circuit.

4. The composite filter circuit of claim 3 in which said selective means comprises a respective switch for selectively shorting across the positive and negative network input terminals of each of said filter networks.

5. The composite filter circuit of claim 4 in which each of said filter networks comprises:

a. an input transformer comprising a primary winding having positive and negative terminals connected to said positive and negative network input terminals, respectively, and a secondary winding having positive and negative terminals;

b. an output transformer comprising a primary winding having positive and negative terminals and a secondary winding having positive and negative terminals connected to said positive and negative network output terminals, respectively; and c. a plurality of filter elements connected between said secondary winding of said input transformer and said primary winding of said output transformer.

6. The composite filter circuit of claim 5 in which said plurality of filter elements comprises first and second capacitors connected in series between said positive terminal of said secondary winding of said input transformer and said positive terminal of said primary winding of said output transformer and a third capacitor connected between the junction of said first and second capacitors and the negative terminals of said secondary winding of said input transformer and said primary winding of said output transformer.

* * * * *